US005974578A

United States Patent [19]
Mizokawa et al.

[11] Patent Number: 5,974,578
[45] Date of Patent: Oct. 26, 1999

[54] INTEGRATED CIRCUIT AND TEST METHOD THEREFOR

[75] Inventors: Takashi Mizokawa; Katsuhiro Hirayama, both of Kyoto, Japan

[73] Assignee: Matsushita Electronics Corporation, Osaka, Japan

[21] Appl. No.: 08/906,260

[22] Filed: Aug. 5, 1997

[30] Foreign Application Priority Data

Aug. 6, 1996 [JP] Japan .................................. 8-206801

[51] Int. Cl.$^6$ .................................................. G01R 31/28
[52] U.S. Cl. ........................................ 714/727; 714/734
[58] Field of Search ............................... 371/22.1, 22.31, 371/22.32, 22.33, 22.34, 22.5, 22.6; 370/241, 242, 248; 714/724, 726, 727, 728, 729, 733, 734, 30

[56] References Cited

U.S. PATENT DOCUMENTS

| | | | |
|---|---|---|---|
| 4,967,142 | 10/1990 | Sauerwald et al. | 324/73.1 |
| 5,225,834 | 7/1993 | Imai et al. | 341/120 |
| 5,416,409 | 5/1995 | Hunter | 324/158.1 |
| 5,506,851 | 4/1996 | Fuse | 371/22.1 |
| 5,793,778 | 8/1998 | Qureshi | 371/22.32 |

FOREIGN PATENT DOCUMENTS 6-347517  12/1994  Japan .

OTHER PUBLICATIONS

K.P. Parker, et al., "Structure and Metrology for an Analog Testability Bus", Proceeding of International Test Conference 1993, Paper 15.2, pp. 390–322, 1993.
An unapproved 1997 IEEE Standard Draft, subject to change, D15, p. 58 and 65, May 16, 1997.

Primary Examiner—Trinh L. Tu
Attorney, Agent, or Firm—McDermott, Will & Emery

[57] ABSTRACT

In a mixed signal integrated circuit containing both an analog core circuit and a digital core circuit, a plurality of dedicated analog boundary scan cells disposed around the analog core circuit are connected in series by a dedicated analog boundary scan path. A plurality of dedicated digital boundary scan cells disposed around a digital core circuit are connected in series by a dedicated digital boundary scan path. The analog and digital boundary scan paths are independent of each other. In testing the analog or digital core circuit, the boundary scan path dedicated thereto is selected so that sets of test control data or test data are shifted only in the boundary scan cells dedicated thereto. As a consequence, a test pattern is shortened and the analog or digital core circuit can efficiently be tested in a shorter period of time.

15 Claims, 15 Drawing Sheets

INTEGRATED CIRCUIT AND TEST METHOD THEREFOR

BACKGROUND OF THE INVENTION

The present invention relates to improvements in a mixed signal integrated circuit containing both an analog circuit and a digital circuit and in a test method therefor.

In the today's industrial world, efficient testing of connections between a plurality of circuits on a printed circuit board is a goal to be attained with a considerably high priority. Under such circumstances, the IEEE (Institute of Electrical and Electronics Engineers, Inc.) adopted a boundary scan technique as a standard in 1990 (IEEE Std 1149.1-1990). Although the standardized technique is useful for a digital circuit, a printed circuit board actually used as a product contains both an analog circuit and a digital circuit. Hence, it has been difficult to test connections between all circuits on the printed circuit board by using the foregoing boundary scan technique.

To overcome the difficulty, the technique of testing an analog circuit or a mixed signal integrated circuit (analog boundary scan) has conventionally been proposed in, e.g., ITC 1993 Paper 15.2 Structure and Metrology for an Analog Testability Bus, Kenneth P. Parker et al. and in Japanese Laid-Open Patent Publication No. 6-347517. Owing to the technique, it has become possible to test device interconnections or an analog discrete component present between the devices in a mixed signal integrated circuit by using no test probe at all or only a reduced number of test probes.

FIG. 15 shows a conventional integrated circuit device 601 using the foregoing analog boundary scan technique. As shown in the drawing, the integrated circuit has: an analog core circuit 602; a digital core circuit 603 connected to the analog core circuit 602 by a connecting line 608; a plurality of analog boundary scan cells 605 disposed around the analog core circuit 602; a plurality of digital boundary scan cells 606 disposed around the digital core circuit 603; a single scan path 607 connecting in series the analog and digital boundary scan cells 605 and 606; an analog test bus 611 for transmitting analog signals for testing (analog test data) to the analog boundary scan cells 605; a test controller 604; an data input terminal 609 for receiving test data; an output terminal 610 for outputting a test result; and an analog test terminals 612 and 613 for receiving and outputting the analog test data.

The digital core circuit 603 receives digital test data which has been inputted to the digital boundary scan cells 606 through the data input terminal 609 and the scan path 607. On the other hand, the analog core circuit 602 is brought into a testable state by test control data for placing the analog core circuit 602 under test which has been inputted to the analog scan cells 605 through the data input terminal 609 and the scan path 607, while receiving analog test data from the analog boundary scan cells 605, which has been inputted to the analog boundary scan cells 605 through the analog test terminals 612 and 613 and the analog test bus 611.

However, in the case of testing, e.g., only the analog core circuit 602 in the conventional integrated circuit, it is necessary to shift sets of test control data in the analog boundary scan cells 605 through the digital boundary scan cells 606, since the scan path 607 contains the analog and digital boundary scan cells 605 and 606. In other words, it is inevitable to concurrently perform the writing of test control data to the analog boundary scan cells (input cells and output cells) 605 of the analog core circuit 602 and the writing of test control data to the digital boundary scan cells (input cells and output cells) 606 of the digital core circuit 603.

Thus, even when only a part of the integrated circuit (e.g., the analog core circuit 602) is to be tested, it is necessary to shift sets of scan test data in a scan chain not to be tested (the digital boundary scan cells 606 for the digital core circuit 603), so that a test pattern is elongated and enlarged while test time is increased disadvantageously. In addition, the process of automatically generating test data for boundary scan is also complicated and elongated in time.

SUMMARY OF THE INVENTION

The present invention has been achieved to solve the foregoing conventional problems. It is therefore an object of the present invention to efficiently test an analog circuit and a digital circuit contained in a mixed signal integrated circuit with the use of an optimum test pattern having a minimum length.

To attain the object, the present invention has adopted a structure in which analog boundary scan cells and digital boundary scan cells are individually connected in series by different scan paths.

Specifically, an integrated circuit according to the present invention comprises: an analog circuit and a digital circuit; a plurality of analog boundary scan cells each connected to the analog circuit to receive test control data for bringing the analog circuit into a testable state; a plurality of digital boundary scan cells each connected to the digital circuit to input test data to the digital circuit or receive a test result outputted from the digital circuit; an analog boundary scan path for connecting in series only the analog boundary scan cells; and a digital boundary scan path for connecting in series only the digital boundary scan cells.

A test method according to the present invention is for testing an integrated circuit comprising an analog circuit and a digital circuit, a plurality of analog boundary scan cells connected to the analog circuit to receive sets of test control data for bringing the analog circuit into a testable state, and a plurality of digital boundary scan cells connected to the digital circuit to input sets of test data to the digital circuit or receive a test result outputted from the digital circuit, the method comprising the steps of: shifting the sets of test control data only in the analog boundary scan cells or shifting the sets of test data only in the digital boundary scan cells; and bringing the analog circuit into the testable state by using the sets of test control data or operating the digital circuit by using the sets of test data.

In the foregoing structure adopted by the present invention, when the analog circuit contained in the mixed signal integrated circuit is to be tested, it is sufficient to select the analog boundary scan path and shift the sets of test control data only in the analog boundary scan cells without shifting the sets of test data in the digital boundary scan cells. When the digital circuit is to be tested, on the other hand, it is sufficient to select the digital boundary scan path and shift the sets of test data only in the digital boundary scan cells without shifting the sets of test control data in the analog boundary scan cells. As a result, a test pattern has an optimumly reduced length and it becomes possible to efficiently test a part of the integrated circuit in a short period of time.

BRIEF DESCRIPTION OF THE DRAWINGS

The accompanying drawings illustrate the preferred embodiments of the present invention.

In the drawings.

DETAILED DESCRIPTION OF THE INVENTION

Figure 1:
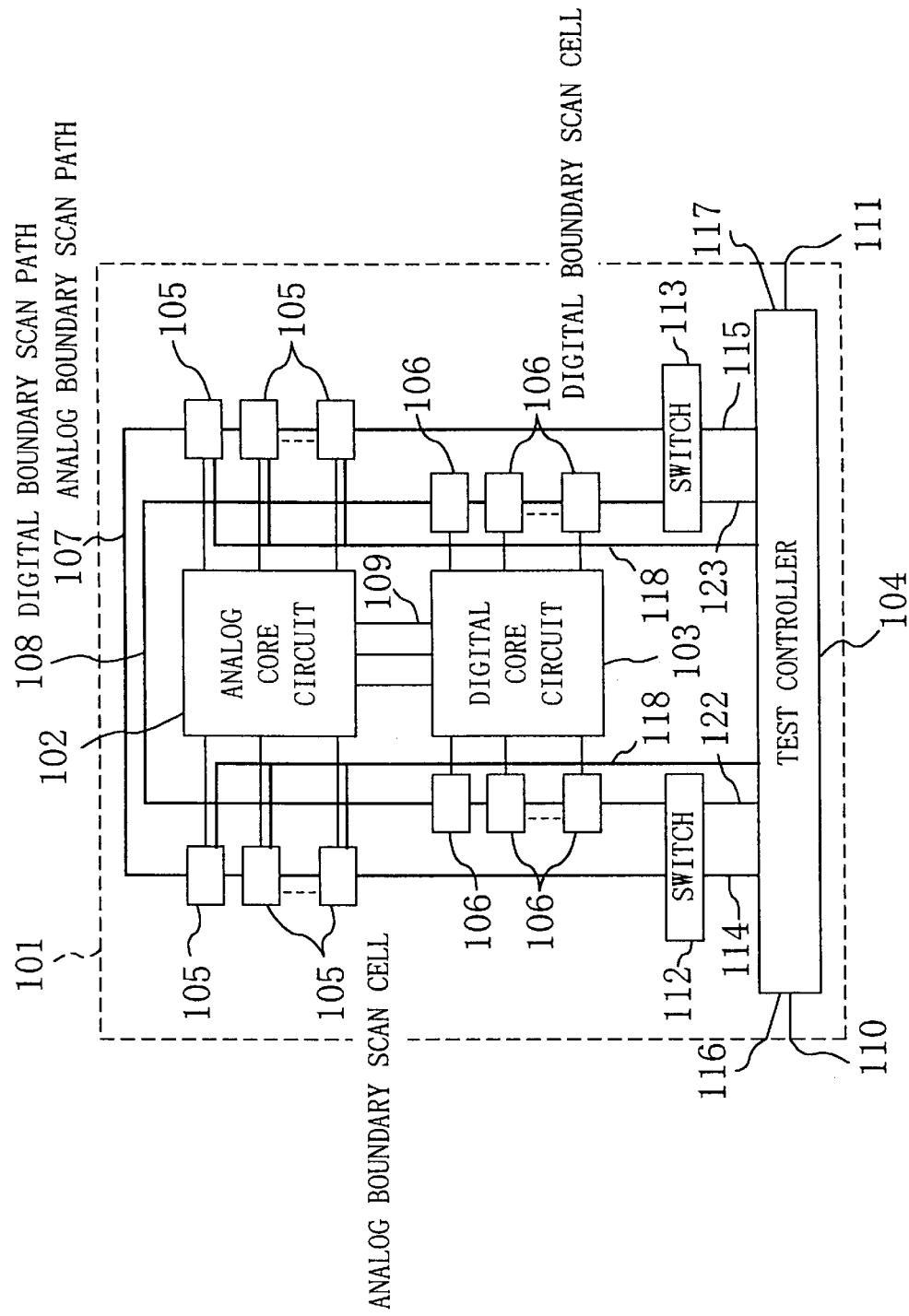
FIG. 1 shows the structure of an integrated circuit according to a first embodiment of the present invention.

Referring now to the drawings, preferred embodiments of the present invention will be described.

First Embodiment

FIG. 1 shows an integrated circuit according to a first embodiment of the present invention.

The integrated circuit 101 shown in FIG. 1 has a data input terminal 110 and a test-result output terminal 111. The integrated circuit 101 is internally provided with an analog core circuit (analog circuit) 102 and a digital core circuit (digital circuit) 103. The analog and digital core circuits 102 and 103 are connected to each other by a plurality of connecting lines (three connecting lines are shown in FIG. 1).

A plurality of analog boundary scan cells 105 are disposed around the analog core circuit 102 and connected in series by an analog boundary scan path 107. Each of the analog boundary scan cells 105 is connected to the input or output terminal of the analog core circuit 102.

Likewise, a plurality of digital boundary scan cells 106 are disposed around the digital core circuit 103 and connected in series by a digital boundary scan path 108. Each of the digital boundary scan cells 106 is connected to an input or output terminal of the digital core circuit 103. The analog and digital boundary scan paths 107 and 108 are independent of each other.

Each of the analog and digital boundary scan paths 107 and 108 has one end connected to a switch (first switch) 112 and the other end connected to a switch (second switch) 113.

There are shown analog test terminals 116 and 117; and an analog test bus 118 through which analog test data is inputted to the plurality of analog boundary scan cells 105.

A test controller 104 tests the interiors of the analog and digital core circuits 102 and 103 and the connection provided therebetween. The test controller 104 is connected to the switches 112 and 113 via the connecting lines 114 and 115, to the data input terminal 110, to the test-result output terminal 111, and to the analog test terminals 116 and 117.

Figure 2:
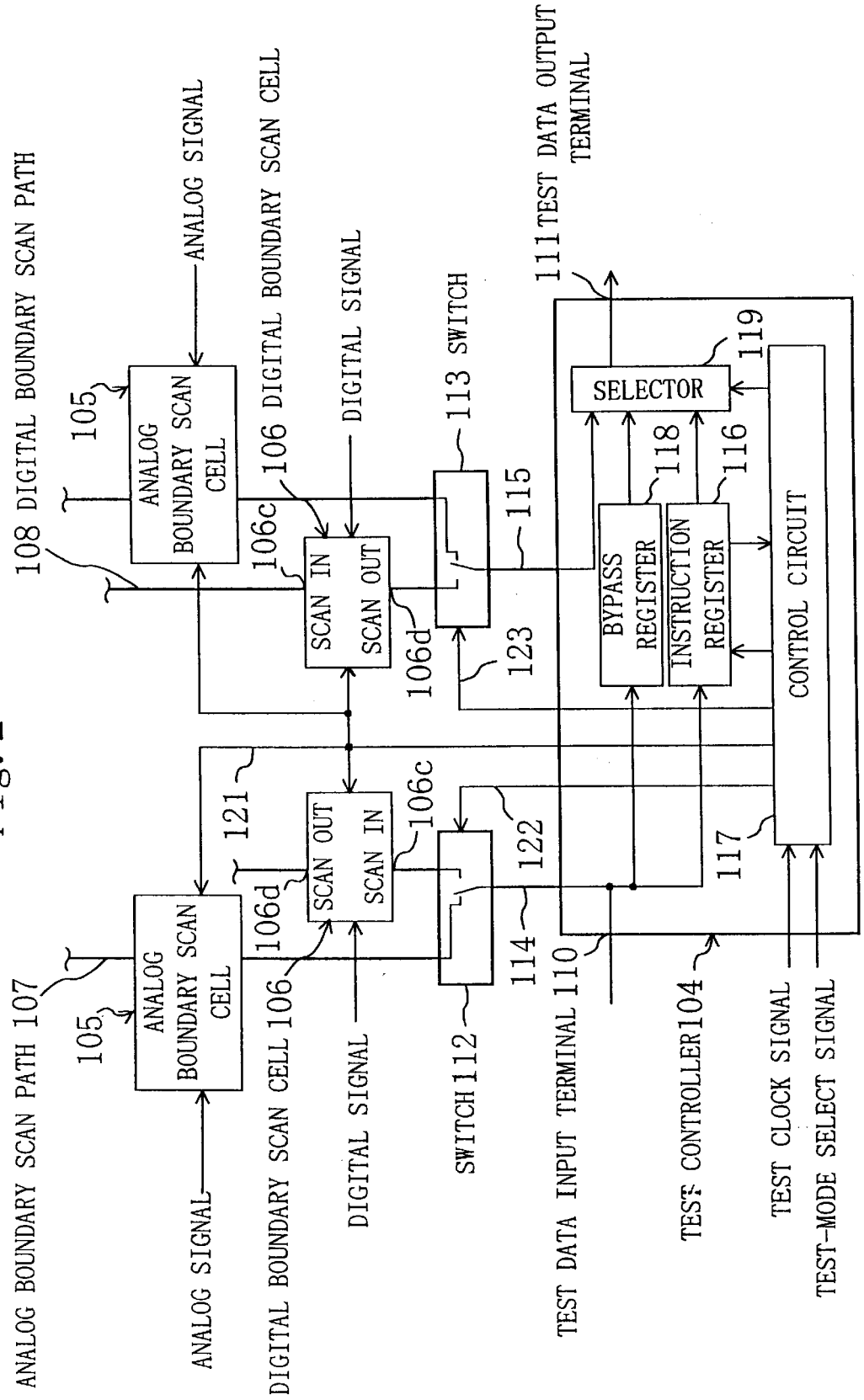
FIG. 2 shows the internal structures of a test controller and a switch provided in the integrated circuit in the first embodiment.

FIG. 2 shows the internal structures of the test controller 104 and of the switches 112 and 113.

As shown in the drawing, the test controller 104 is internally provided with an instruction register 116, a control circuit 117, a bypass register 118, and a selector 119. The instruction register 116 stores an instruction code inputted to the data input terminal 110. The control circuit 117 receives the instruction code stored in the instruction register 116, a test clock signal inputted from the outside, and a test-mode select signal inputted from the outside and outputs change-over signals to the plurality of analog and digital boundary scan cells 105 and 106 via a signal line 121 so that they are switched, while outputting other change-over signals to the two switches 112 and 113 via signal lines 122 and 123 so that they are switched. The switches 112 and 113 receive the corresponding change-over signals and connect the respective connecting lines 114 and 115 connected thereto to either of the digital boundary scan paths 107 and 108 depending on the values of the received change-over signals. The bypass register 118 stores data inputted to the data input terminal 110 and outputs the stored data as it is from the test-result output terminal 111 via the selector 119. The selector 119 receives a test result obtained from the digital boundary scan path 108 via the switch 113 and connecting line 115 and respective outputs from the two registers 116 and 118, selects any one of them, and outputs the selected one to the test-result output terminal 111.

Figure 3:
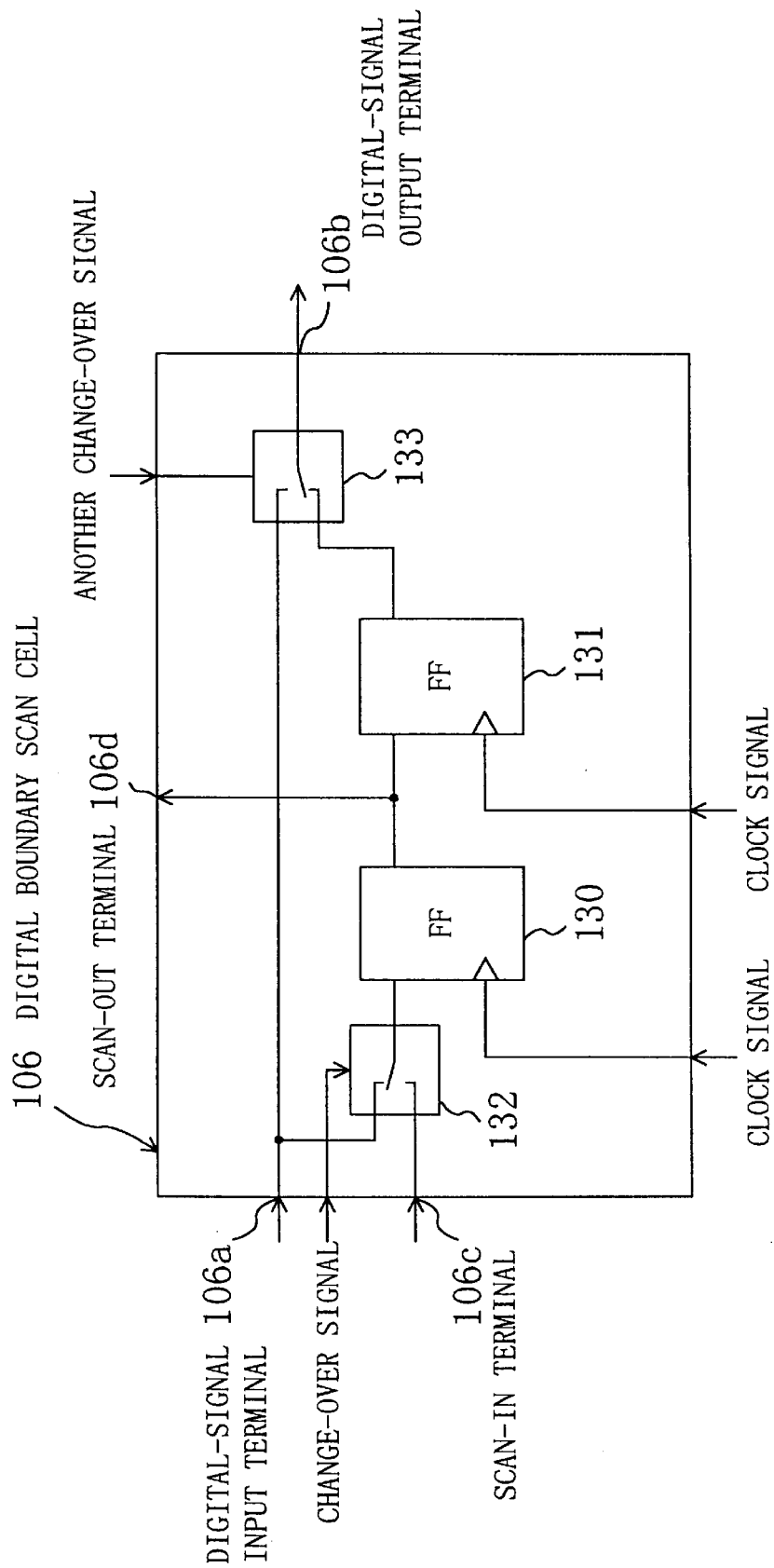
FIG. 3 shows the internal structure of a digital boundary scan cell in the first embodiment.

FIG. 3 shows the internal structure of the digital boundary scan cell 106. As shown in the drawing, the digital scan cell 106 has a digital-signal input terminal 106a, a digital-signal output terminal 106b, a scan-in terminal 106c, and a scan-out terminal 106d. The digital boundary scan path 108 are intervened by the digital scan cells 106 each having the scan-in and scan-out terminals 106c and 106d.

The digital boundary scan cell 106 is internally provided with two flip-flops 130 and 131 and with two selectors 132 and 133. The selector 132 receives the change-over signal from the test controller 104 and connects either of the digital-signal input terminal 106a and the scan-in terminal 106c to the anterior flip-flop 130 depending on the value of the received change-over signal. The output terminal of the anterior flip-flop 130 is connected to the scan-out terminal 106d and to the input terminal of the posterior flip-flop 131. The other selector 133 receives the other change-over signal and connects either of the digital-signal input terminal 106a and the output terminal of the posterior flip-flop 131 to the digital-signal output terminal 106b depending on the value of the received change-over signal. In a scanning operation, therefore, a test value inputted to the scan-in terminal 106c is inputted by the selector 132 to the anterior flip-flop 130, while an output from the flip-flop 130 is outputted from the scan-out terminal 106d to the scan-in terminal of the digital boundary scan cell in the subsequent stage. The digital signal stored in the posterior flip-flop 131 is outputted by the selector 133 to the digital-signal output terminal 106b and inputted therefrom to the digital core circuit 103.

The internal structure of the analog boundary scan cell 105, which is not shown, is disclosed in pages 65 and 58 of the document (D15 May 16, 1997) issued by the IEEE (Institute of Electrical and Electronics Engineers, Inc.). The structure has been proposed by the IEEE but has not been standardized thereby. If a brief description is given to the structure, the analog boundary scan cell 105 has a scan-in terminal, a scan-out terminal, a plurality of flip-flops interposed between the two terminals, a control logic, and a plurality of switches. Respective values are inputted to the scan-in terminal and set to the respective flip-flops. The set values are decoded by the control logic so that the switches are switched based on the result of decoding to enable or disable the inputting of an external signal to the analog core circuit or, alternatively, place the input line for the analog core circuit 102 on the level of a power-source voltage (High) or on the level of a ground potential (Low). In scanning operation, respective values are inputted to the scan-in terminal and set to the flip-flops so that the set values are outputted from the scan-out terminal.

Figure 4:
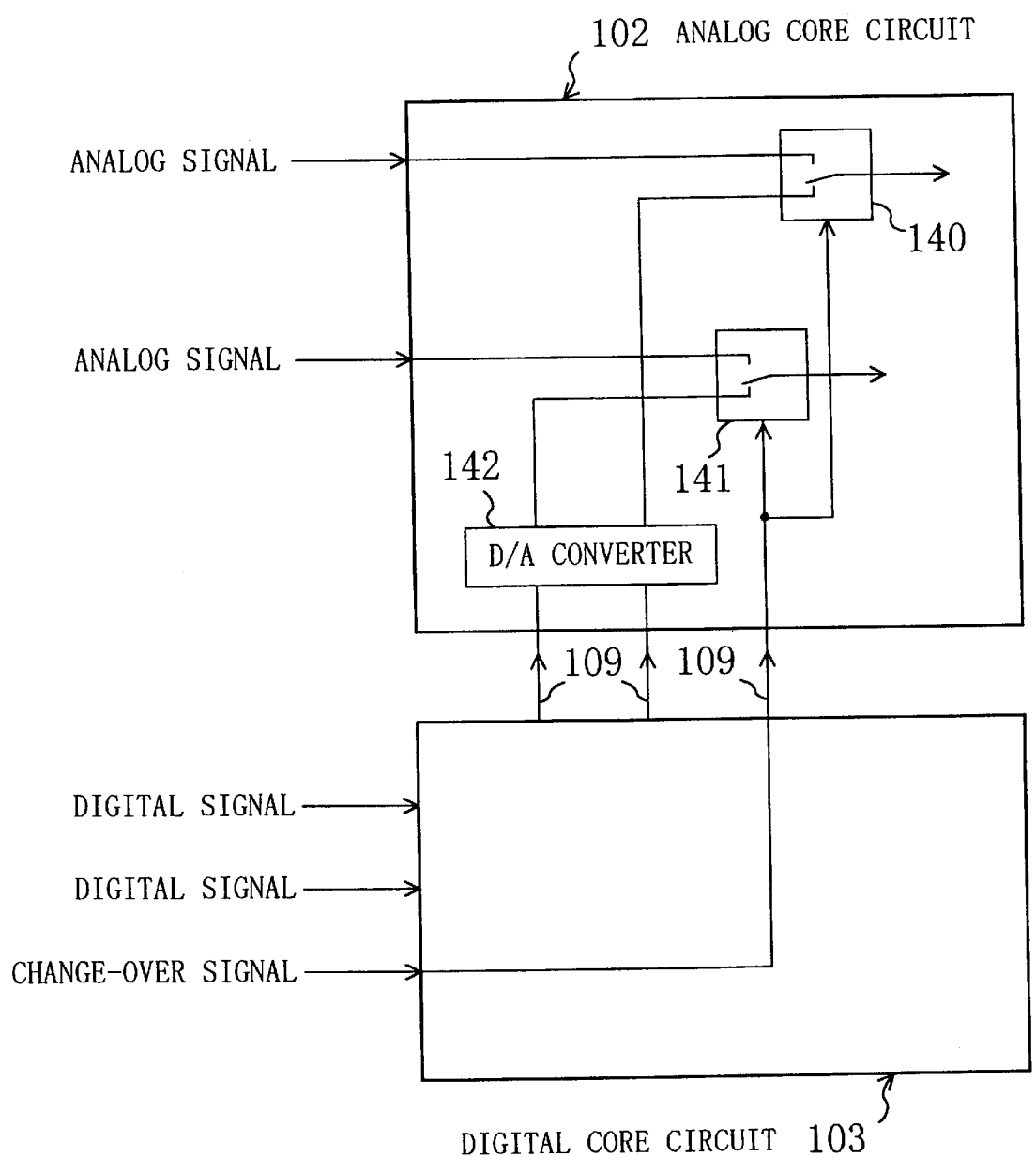
FIG. 4 shows a main structure inside an analog core circuit in the first embodiment.

FIG. 4 shows the structure of a main portion for transmitting signals between the analog core circuit 102 and the digital core circuit 103. As shown in the drawing, the analog core circuit 102 has two selectors 140 and 141 and a D/A converter 142. The D/A converter 142 receives a digital signal from the digital core circuit 103 via connecting lines 109 and converts the received signal to an analog signal. Each of the selectors 140 and 141 receives the analog signal inputted to the analog core circuit 102 and the analog signal through the D/A converter 142 and selects either one of the analog signals. The selection is made based on the change-over signal inputted from the digital core circuit 103 via the connecting lines 109.

Although FIG. 4 shows only the internal structure of the analog core circuit 102, the analog signal received by the analog circuit 102 is subjected to A/D conversion and a digital signal through conversion is used in the digital core circuit 103. Hence, the internal structure of the digital core circuit 103 is the same as the internal structure of the analog core circuit 102 described above.

The operation of the integrated circuit thus constituted according to the present embodiment will be described with reference to FIG. 1. By way of example, the description will be limited to the case of testing the analog core circuit 102.

First, an instruction code is set in the instruction register 116 of the test controller 104 to signally disconnect the digital core circuit 103 from the analog core circuit 102 so that the analog core circuit 102 is tested independently.

Next, another instruction code from the data input terminal 110 is received to change the content of the instruction register 116 of the test controller 104. In response to the instruction code in the instruction register 116, the control circuit 117 outputs the respective change-over signals to the analog boundary scan cells 105 and to the two switches 112 and 115. As a result, each of the analog boundary scan cells 105 is set in a mode wherein test control data is inputted to the scan-in terminal and outputted from the scan-out terminal via the flip-flops, while the switches 112 and 113 are switched to the analog boundary scan path 107.

Subsequently, sets of test control data are inputted to the data input terminal 110 from the outside and shifted in the corresponding analog boundary scan cells 105 through the switch 112 and analog boundary scan path 107, thereby determining conditions for testing the analog core circuit 102 and bringing the analog core circuit 102 in a specified testable state. Then, sets of analog test data are inputted to the plurality of analog boundary scan cells 105 through the analog test terminals 116 and 117 and the analog test bus 118. The sets of analog test data are further inputted to the analog core circuit 102 through the analog boundary scan cells 105 to test the analog core circuit 102.

Likewise, conditions for the subsequent test are determined and the foregoing operation is repeated to perform a plurality of tests on the analog core circuit 102 (on a plurality of pins thereof).

Thus, when either of the analog and digital core circuits 102 and 103 is tested in the present embodiment, only the dedicated analog or digital boundary scan path 107 or 108 is selected, so that it is unnecessary to shift sets of test data or test control data in the digital or analog boundary scan cells 106 or 105 dedicated to the other digital or analog core circuit 103 or 102. As a result, the test pattern can be shortened and efficient testing can be performed in a shorter period of time.

Second Embodiment

Figure 5:
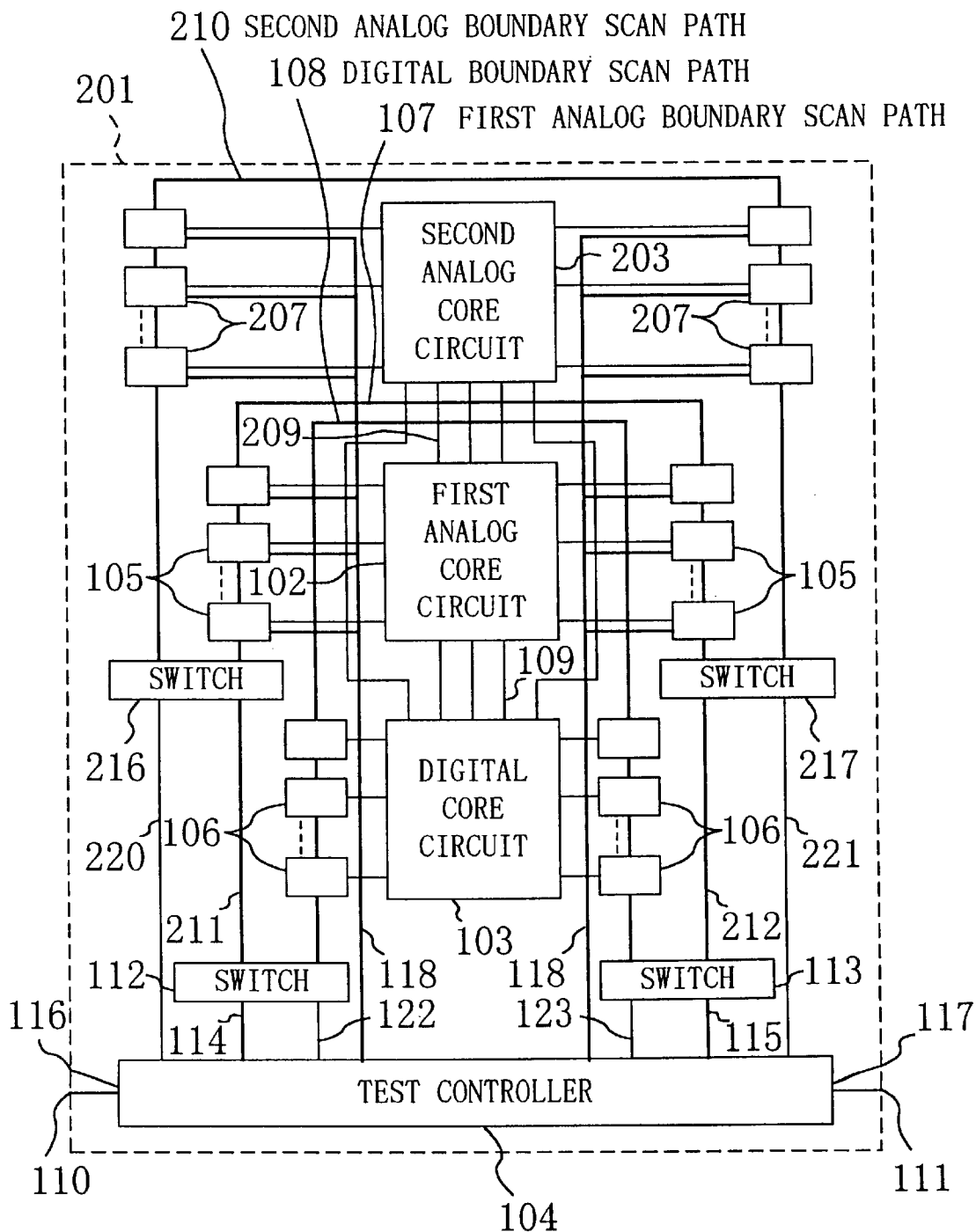
FIG. 5 shows the structure of an integrated circuit according to a second embodiment of the present invention.

FIG. 5 shows the structure of an integrated circuit according to a second embodiment of the present invention. The present embodiment will describe the integrated circuit 201 containing two analog core circuits. As for the same components as used in the integrated circuit shown in FIG. 1 illustrating the first embodiment, the description thereof will be omitted by providing the same reference numerals.

In the drawing are shown: a second analog core circuit (another analog circuit) 203 provided in addition to the analog core circuit (first analog core circuit) 102; and a plurality of analog boundary scan cells 207 disposed around the second analog core circuit 203. Each of the analog boundary scan cells 207 is connected to the input or output terminal of the second analog core circuit 203.

The plurality of analog boundary scan cells 207 are connected in series by a second analog boundary scan path 210, which is independent of the analog boundary scan path (first analog boundary scan path) 107. The analog boundary scan cells 207 are also connected to the analog test bus 118.

The first and second analog core circuits 102 and 203 are connected to each other by signal lines 209.

A switch 216 is connected to the switch 112 via a connecting line 211 such that the connecting line 211 is connected to one end of either of the first and second analog boundary scan paths 107 and 210. The switch 216 is controlled by the change-over signal received from the test controller 104 via a connecting line 220. A switch 217 is connected to the switch 113 via a connecting line 212 such that the connecting line 212 is connected to either of the first and second analog boundary scan paths 107 and 210. The switch 217 is also controlled by the change-over signal received from the test controller 104 via a signal line 221.

Since the operation of the integrated circuit in the present embodiment is the same as that of the integrated circuit in the first embodiment, the description thereof will be omitted.

Although the present embodiment has the two analog core circuits 102 and 203, the two switches 216 and 217 allow either one of the first and second analog boundary scan paths 107 and 210 to be selected. Accordingly, only the analog boundary scan cells 105 are used in testing the first analog core circuit 102, while only the analog boundary scan cells 207 are used in testing the second analog core circuit 102, so that sets of test control data are shifted in the corresponding analog core circuits. As a result, conditions for testing the individual analog circuits can be set easily in a short period of time.

Variation of Second Embodiment

Figure 6:
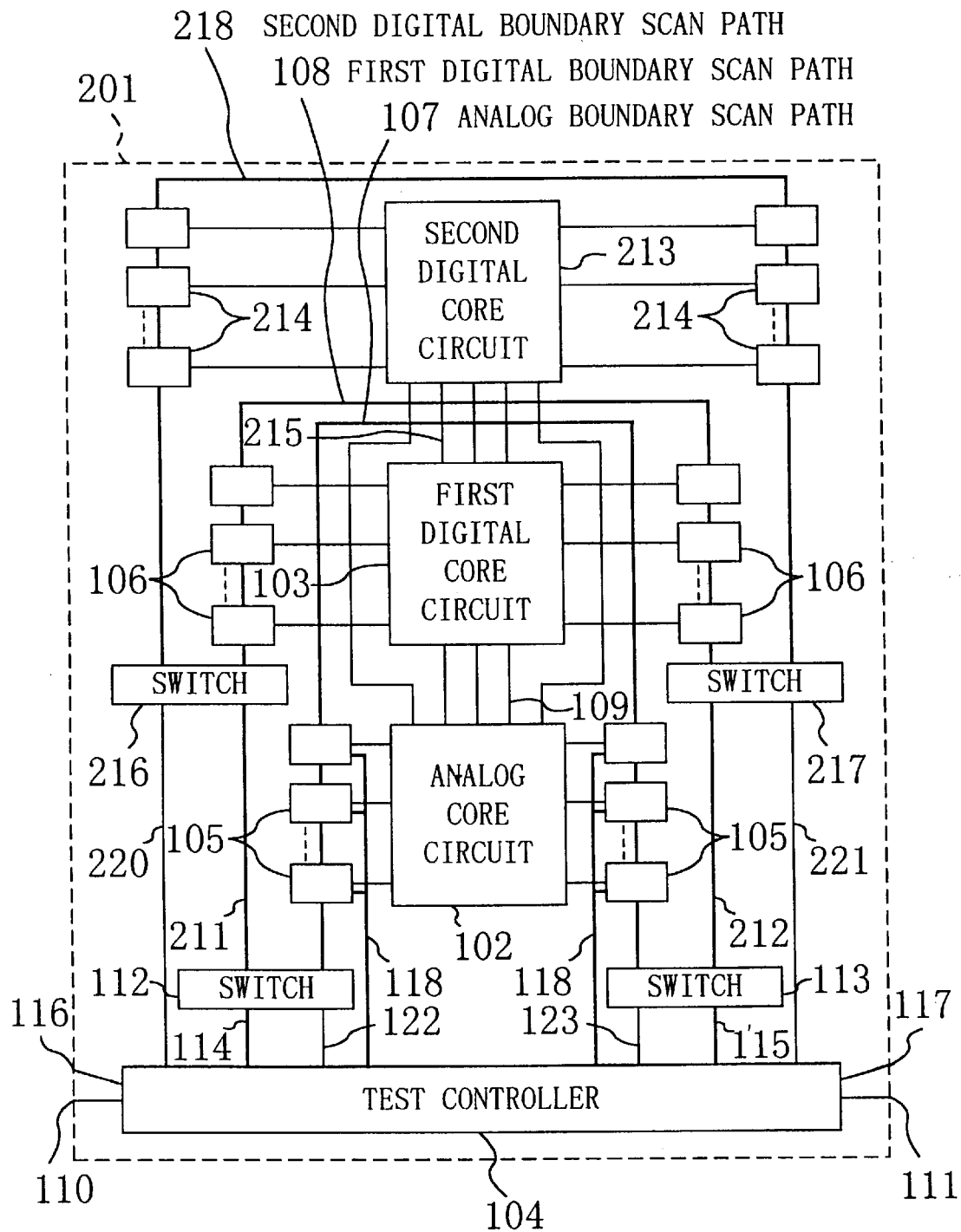
FIG. 6 shows a variation of the integrated circuit in the second embodiment.

FIG. 6 shows a variation of the second embodiment provided with two digital core circuits, which is different from the second embodiment provided with the two analog core circuits.

In the drawing are shown: a second digital core circuit (another digital circuit) 213 provided in addition to the digital core circuit (first digital core circuit) 103. A plurality of digital boundary scan cells 214 are disposed around the second digital core circuit 213. The digital boundary scan cells 214 are connected in series by a second digital boundary scan path 128. The first and second digital core circuits 103 and 213 are connected to each other by signal lines 215.

Since the operation of the integrated circuit in the present variation is the same as that of the integrated circuit in the first embodiment, the description thereof will be omitted.

Third Embodiment

Figure 7:
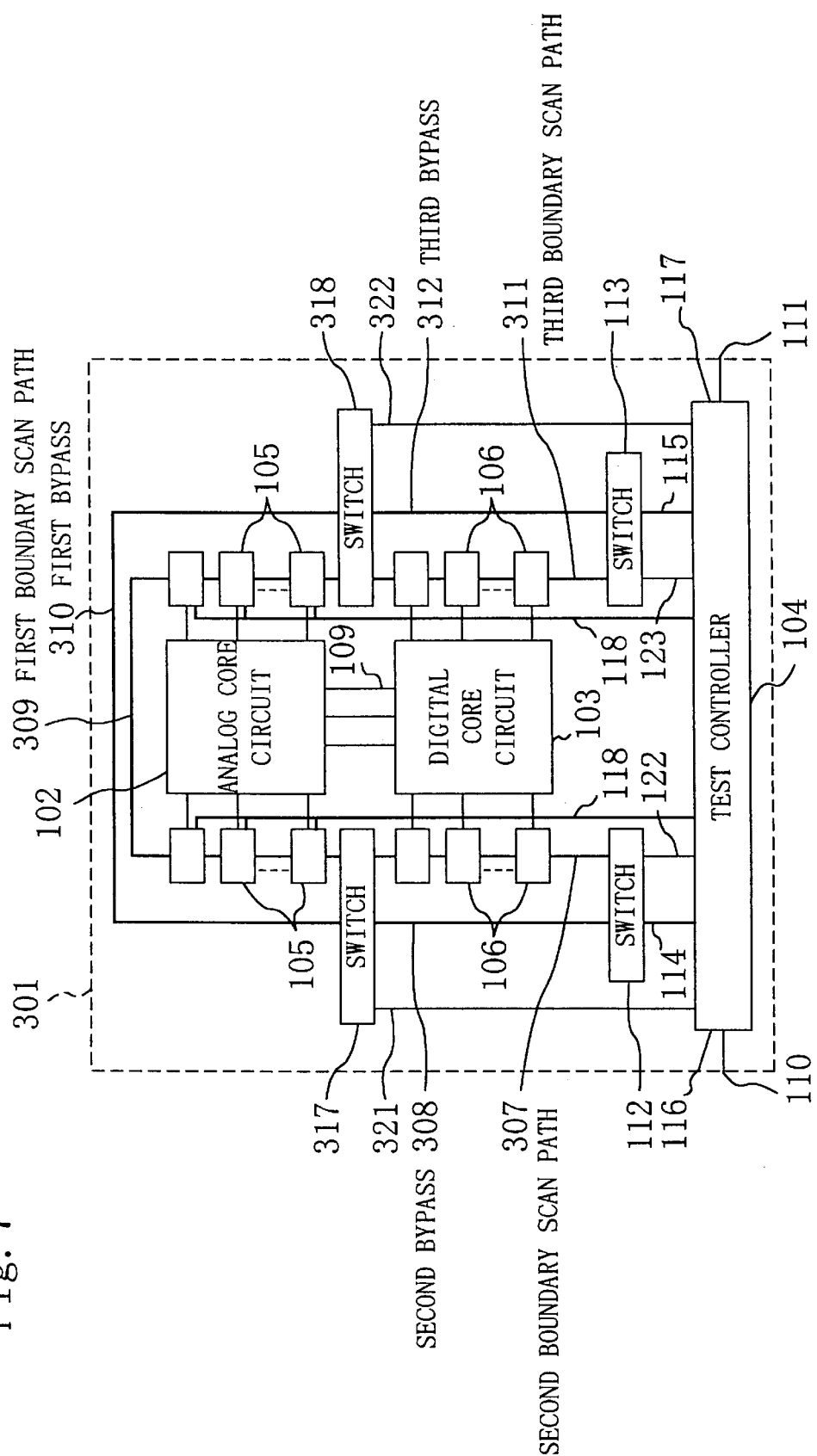
FIG. 7 shows the structure of an integrated circuit according to a third embodiment of the present invention.

FIG. 7 shows the structure of an integrated circuit 301 according to a third embodiment. As for the same components as used in the integrated circuit in the first embodiment, the description thereof will be omitted by providing the same reference numerals.

In the drawing are shown: a first boundary scan path 309 for connecting in series the plurality of analog boundary scan cells 105 disposed around the analog core circuit 102; and a first bypass 310 disposed in parallel with the first boundary scan path 309.

There are also shown: a second boundary scan path 307 for connecting in series the plurality of digital boundary scan cells 106 located on the left of the digital core circuit 103; a second bypass 308 disposed in parallel with the second boundary scan path 307; a third boundary scan path 311 for connecting in series the plurality of digital boundary scan cells 106 located on the right of the digital core circuit 103; and a third bypass 312 disposed in parallel with the third boundary scan path 311.

The switch 112 connects the connecting line 114 to one end of either the second boundary scan path 307 or the second bypass 308. The switch 317 connects the other end of either the second boundary scan path 307 or the second bypass 308 to one end of either the first boundary scan path 309 or the first bypass 310. The switch 318 connects the other end of either the first boundary scan path 309 or the first bypass 310 to one end of either the third boundary scan path 311 or the third bypass 312. The switch 113 connects the other end of either the third boundary scan path 311 or the third bypass 312 to the connecting line 115.

The operation of the integrated circuit in the present embodiment will be described with reference to FIG. 7. Since fundamental testing procedures are the same as for the integrated circuit in the first embodiment, the description will be given to switching among the scan paths via the four switches 112, 113, 317, and 318.

Figure 8A:
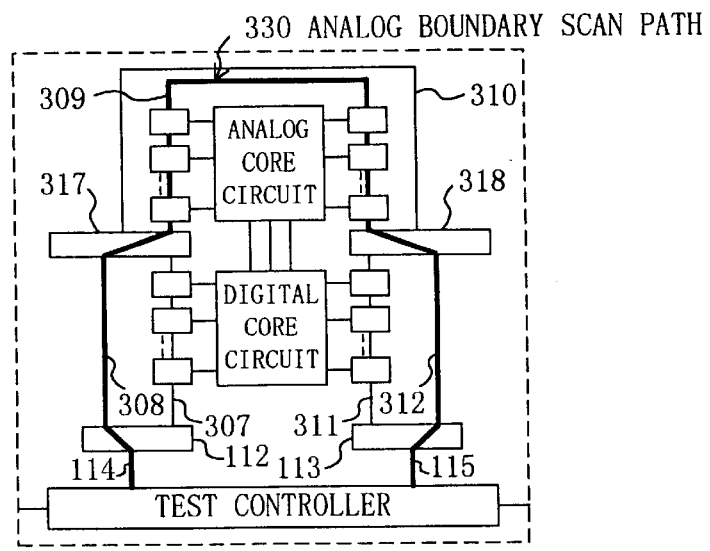
FIG. 8(a) illustrates the formation of an analog boundary scan path in the integrated circuit in the third embodiment.

In testing the analog core circuit 102, the switches are switched as illustrated in FIG. 8(a). Through the switching operation, the connecting line 114, the second bypass 308, the first boundary scan path 309, the third bypass 312, and the connecting line 115 are connected in series as indicated by the bold line to constitute an analog boundary scan path 330.

Figure 8B:
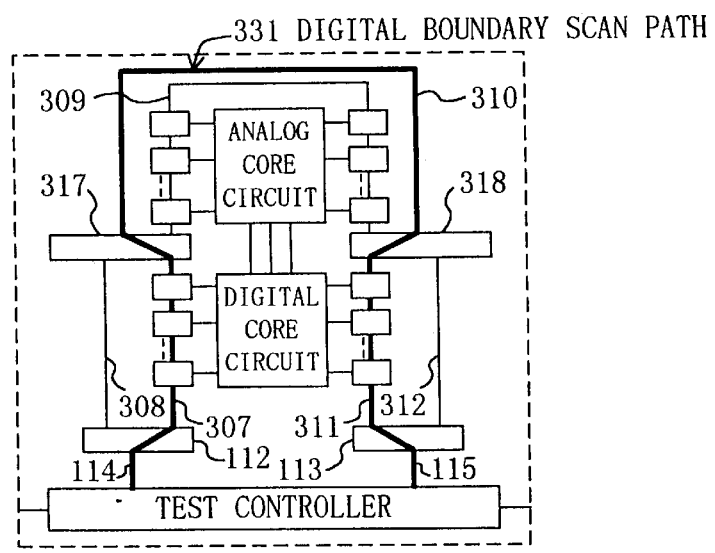
FIG. 8(b) illustrates the formation of a digital boundary scan path.

In testing the digital core circuit 103, the switches are switched as illustrated in FIG. 8(b). Through the switching operation, the connecting line 114, the second boundary scan path 307, the first bypass 310, the third boundary scan path 311, and the connecting line 115 are connected in series as indicated by the bold line to constitute a digital boundary scan path 331.

Figure 8C:
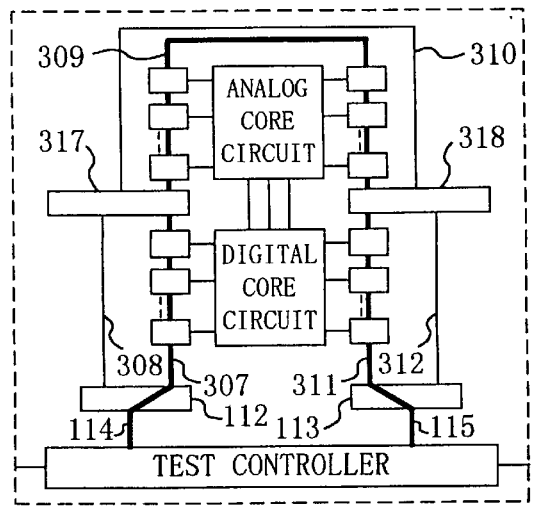
FIG. 8(c) illustrates the formation of a boundary scan path in simultaneously testing an analog core circuit and a digital core circuit.

In testing the analog and digital core circuits 102 and 103 simultaneously, the switches are switched as illustrated by the bold line in FIG. 8(c). Through the switching operation, the connecting line 114, the second boundary scan path 307, the first boundary scan path 309, the third boundary scan path 311, and the connecting line 115 are connected in series.

In testing the analog core circuit 102 in the present embodiment, therefore, test control data can be shifted only in the plurality of analog boundary scan cells 105 by bypassing the plurality of digital boundary scan cells 106 via the two bypasses 308 and 311, which simplifies the test pattern and allows easy testing of the analog core circuit 102 in a short period of time. The same shall apply to the testing of the digital core circuit 103.

Variation of Third Embodiment

Figure 9:
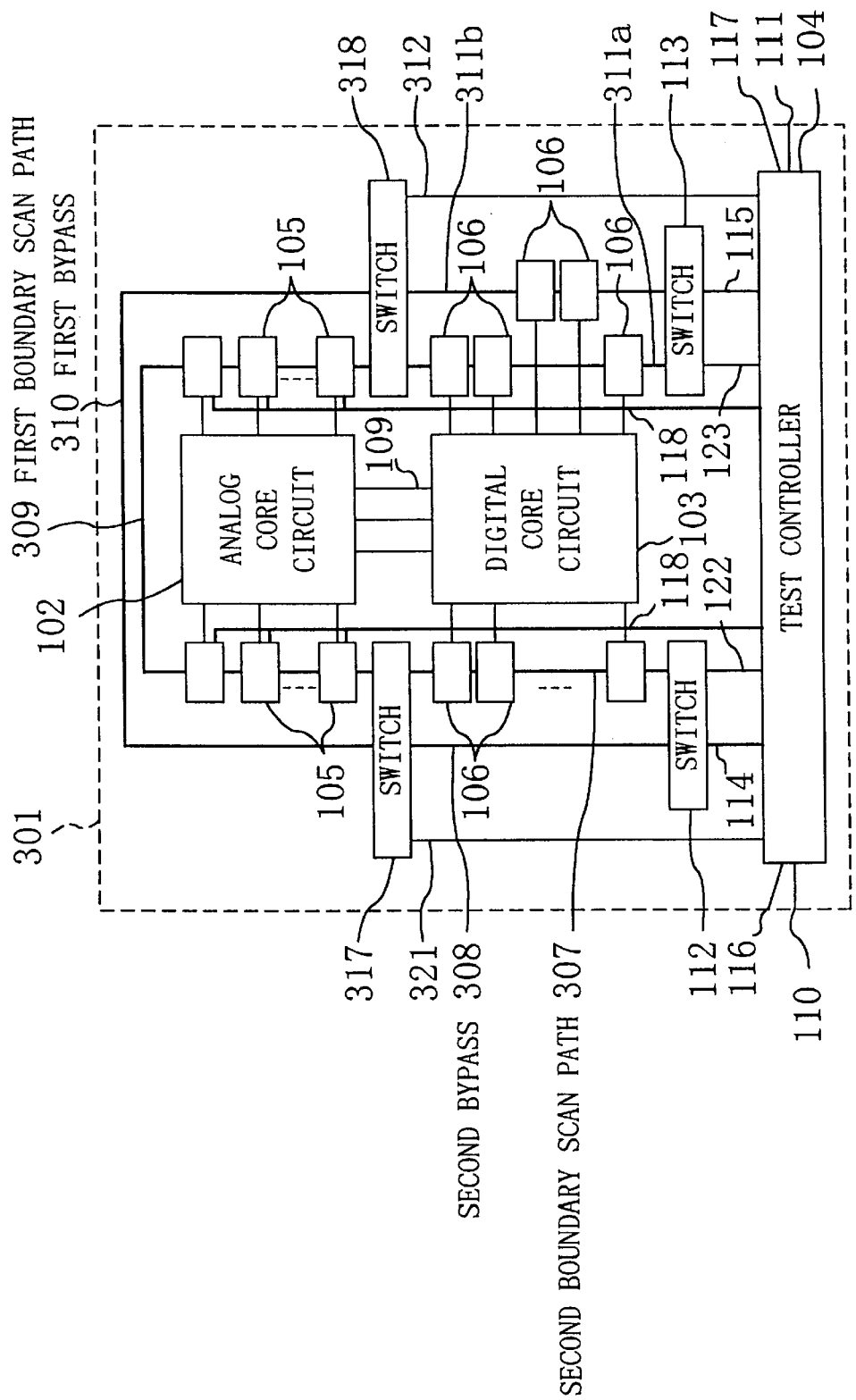
FIG. 9 shows the structure of a variation of the integrated circuit in the third embodiment.

FIG. 9 shows a variation of the third embodiment. Unlike the third embodiment in which the single third boundary scan path 311 is used to connect in series all the digital boundary scan cells 106 located on the right of the digital core circuit 103, the third boundary scan path 311 is divided into a plurality of (two in FIG. 9) boundary scan paths 311a and 311b arranged in parallel in the present variation. The boundary scan path 311a connects some of the plurality of digital boundary scan cells 106 in series, while the boundary scan path 311b connects the other digital boundary scan cells 106 in series.

In testing the digital core circuit 103 in the foregoing structure, test data can be shifted only in the digital boundary scan cells 106 necessary by bypassing some of the digital boundary scan cells 106 as well as all the analog boundary scan cells 105. Hence, the digital core circuit 103 can be tested more efficiently than in the third embodiment.

Although the present variation has divided the third digital boundary scan path 311 into two, it will be appreciated that the third digital boundary scan path 311 may also be divided into three or more.

Another Variation of Third Embodiment

Figure 10:
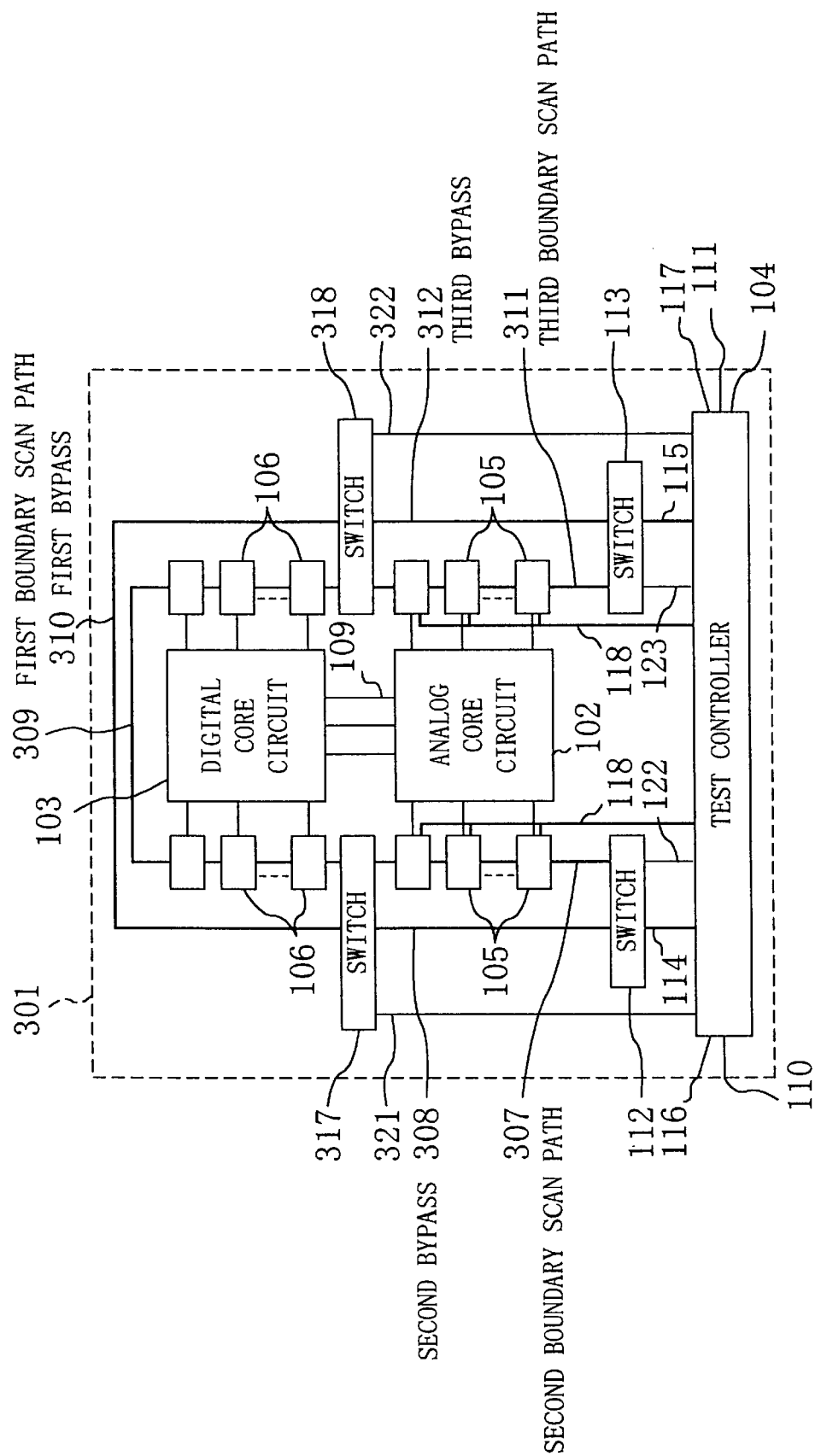
FIG. 10 shows the structure of another variation of the integrated circuit in the third embodiment.

FIG. 10 shows another variation of the third embodiment. Unlike the third embodiment in which the analog core circuit 102 is positioned above the digital core circuit 103, the digital core circuit 103 is positioned above the analog core circuit 102 in the present variation.

As shown in the drawing, the present variation uses the first boundary scan path 309 to connect the plurality of digital boundary scan cells 106 disposed around the digital core circuit 103, while using the second and third boundary scan paths 307 and 311 to connect the analog boundary scan cells 105 disposed around the analog core circuit 102. As for the other components, they are the same as used in the third embodiment, so that the description thereof is omitted by providing the same reference numerals.

Figure 11A:
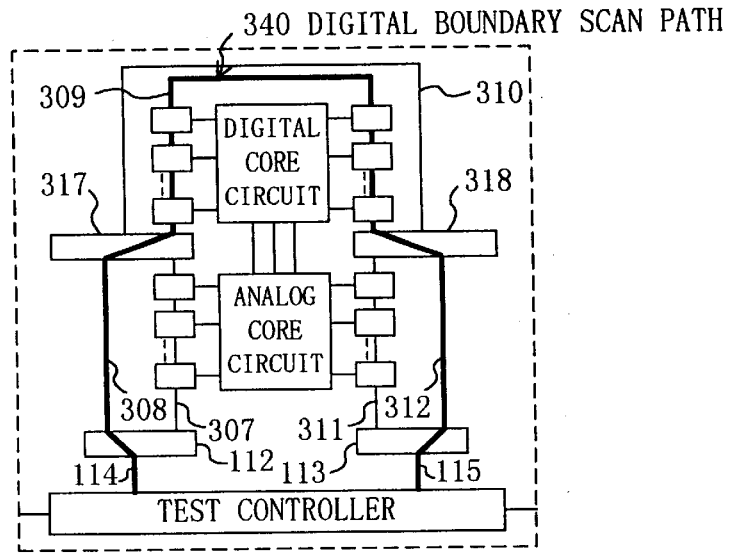
FIG. 11(a) illustrates the formation of an analog boundary scan path in the integrated circuit of the other variation of the third embodiment.
Figure 11B:
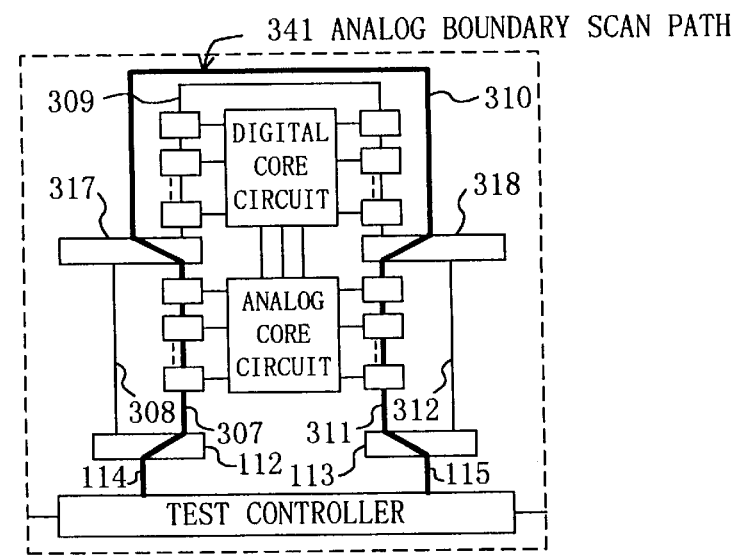
FIG. 11(b) illustrates the formation of a digital boundary scan path.
Figure 11C:
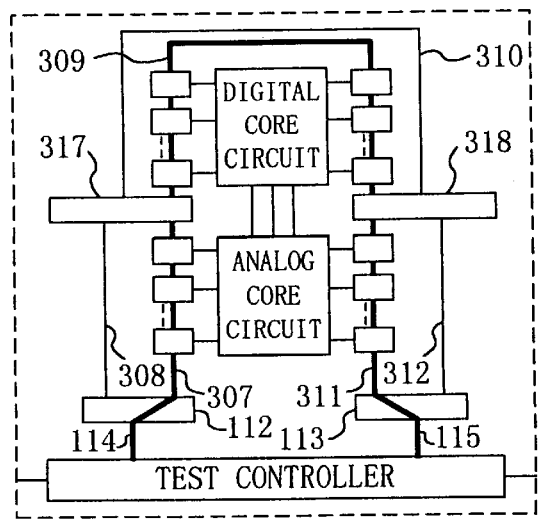
FIG. 11(c) illustrates the formation of a boundary scan path in simultaneously testing an analog core circuit and a digital core circuit.

In the present variation, therefore, a digital boundary scan path 340 is constituted by the connecting line 114, the second bypass 308, the first boundary scan path 309, the third bypass 312, and the connecting line 115, as indicated by the bold line in FIG. 11(a). On the other hand, an analog boundary scan path 341 is constituted by the connecting line 114, the second boundary scan path 307, the first bypass 310, the third boundary scan path 311, and the connecting line 115, as indicated by the bold line in FIG. 11(b). In testing the analog and digital circuits 102 and 103 simultaneously, the constitution indicated by the bold line in FIG. 11(c) is adopted, which is the same as adopted in the third embodiment illustrated in FIG. 8(c).

Figure 12:
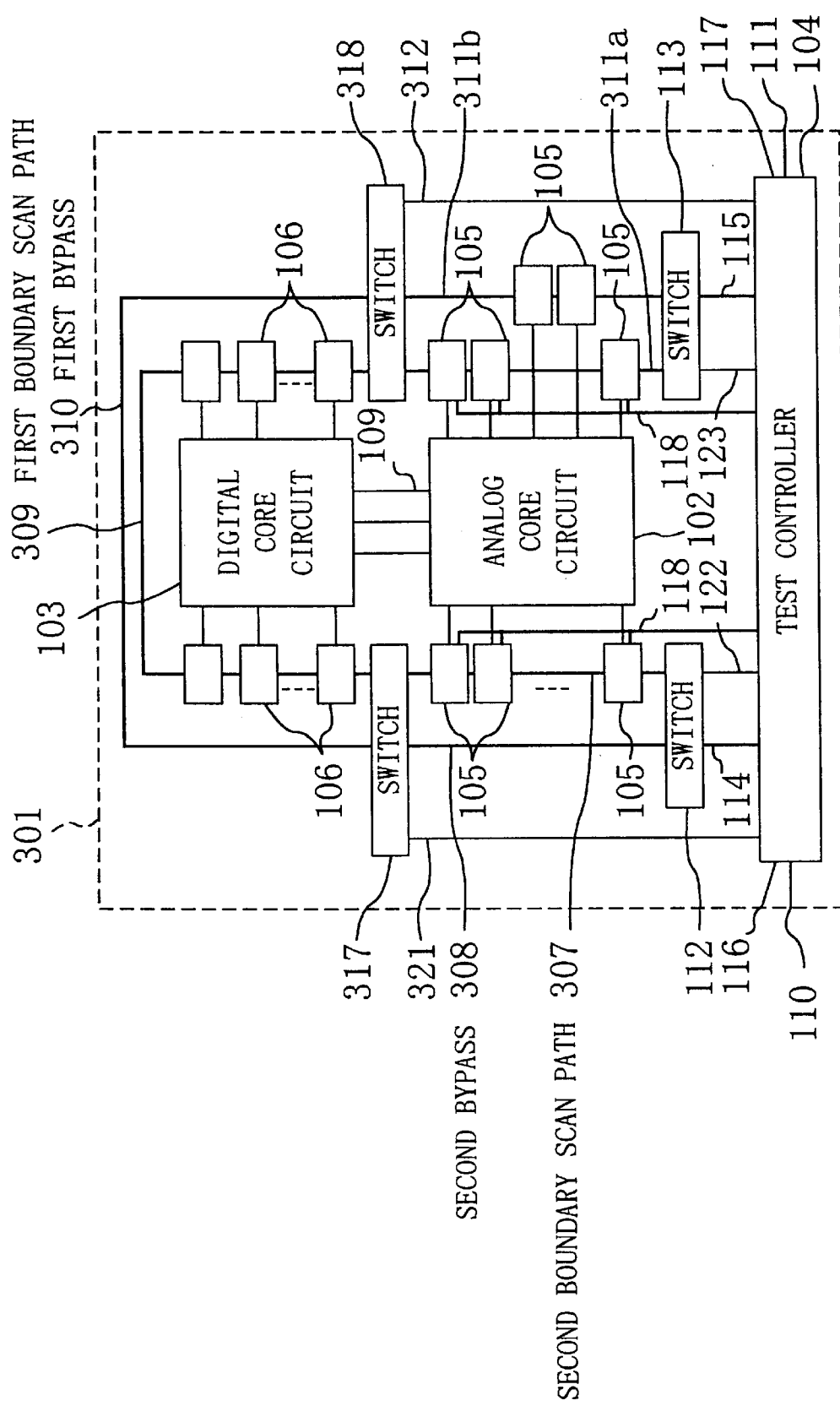
FIG. 12 shows still another variation of the third embodiment.

It will be appreciated that, as shown in FIG. 12, the third boundary scan path 311 may also be divided into the two boundary scan paths 311a and 311b in the integrated circuit shown in FIG. 10.

Fourth Embodiment

Figure 13:
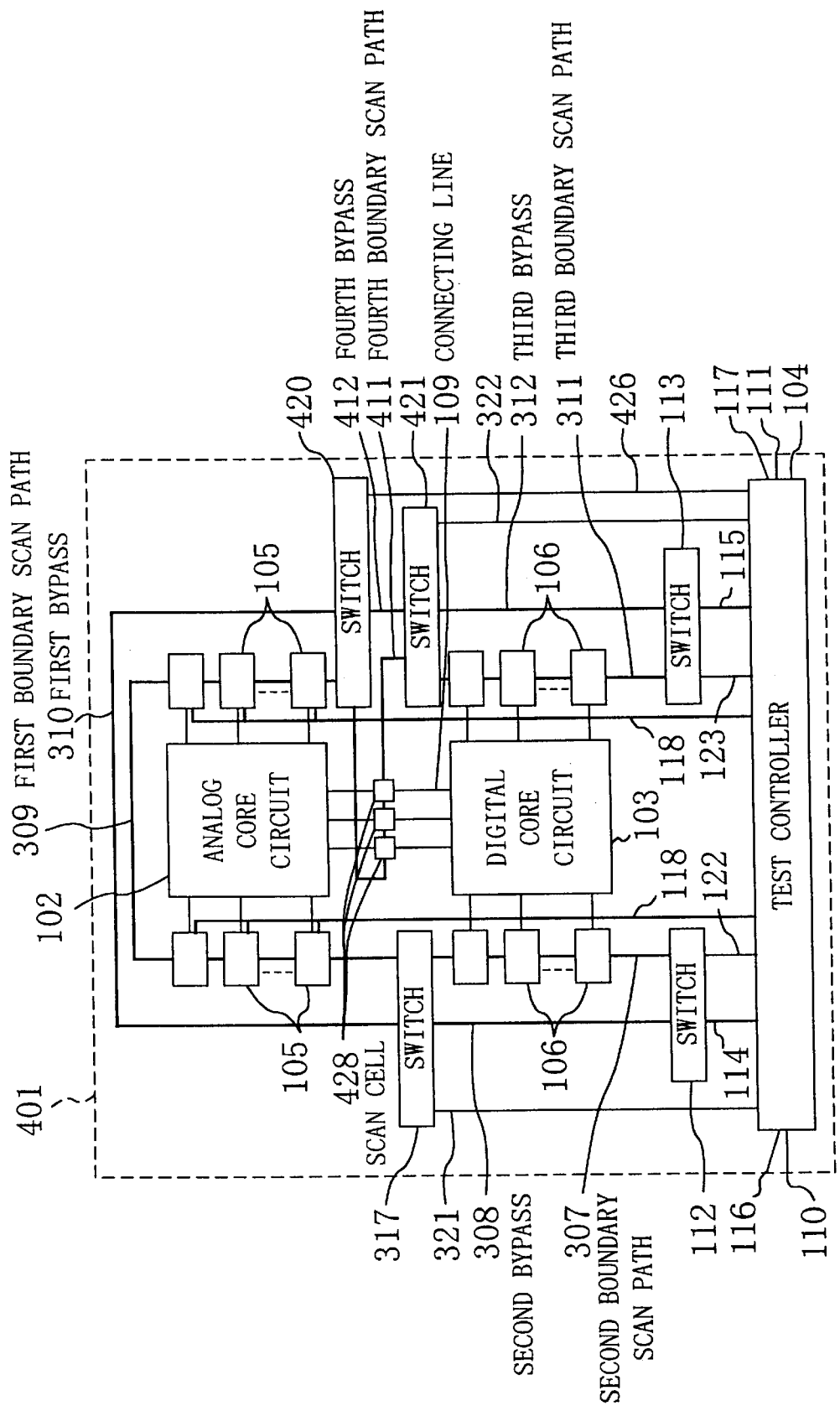
FIG. 13 shows the structure of an integrated circuit according to a fourth embodiment of the present invention.

FIG. 13 shows the structure of an integrated circuit according to a fourth embodiment.

The present embodiment is achieved by adding the following structure to the integrated circuit shown in FIG. 7 illustrating the third embodiment. The plurality of connecting lines (three connecting lines are shown in the drawing) 109 for connecting the analog and digital core circuits 102 and 103 are intervened by respective scan cells 428, which are connected in series by a fourth boundary scan path 411. A fourth bypass 412 is also disposed to bypass the fourth boundary scan path 411. The fourth boundary scan path 411 and the fourth bypass 412 have one ends connected to a switch 420 and the other ends connected to another switch 421.

The switch 420 connects one end of the fourth boundary scan path 411 or fourth bypass 412 to the first boundary scan path 309 or first bypass 310. The switch 421 connects the other end of the fourth boundary scan path 411 or fourth bypass 412 to the third boundary scan path 311 or third bypass 312. The test controller 104 controls the two switches 420 and 421.

Figure 14A:
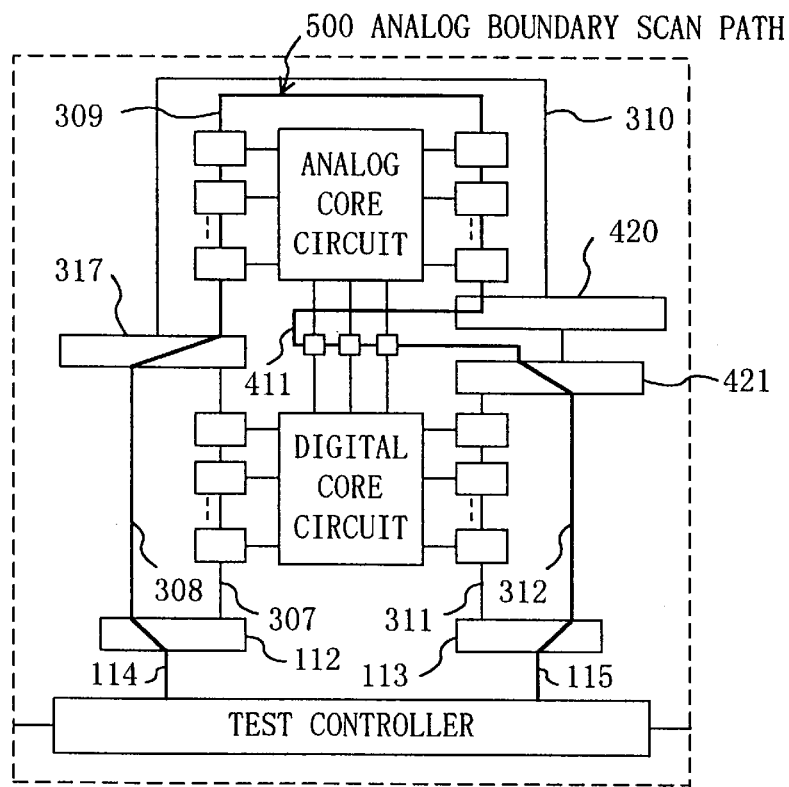
FIG. 14(a) illustrates the formation of an analog boundary scan path in the integrated circuit of the fourth embodiment.

According to the present embodiment, in testing the analog core circuit 102, the switches 112, 113, 317, 420, and 421 are switched as illustrated in FIG. 14(a). As a result, the connecting line 114, the second bypass 308, the first boundary scan path 309, the fourth boundary scan path 411, the third bypass 312, and the connecting line 115 are connected in series to compose an analog boundary scan path 500, as indicated by the bold line in the drawing.

Figure 14B:
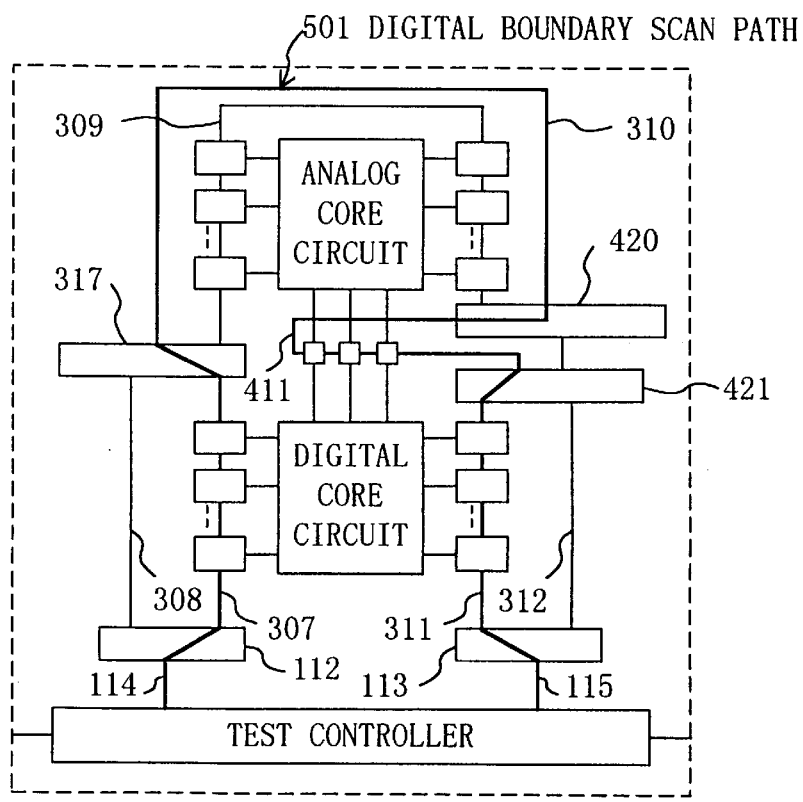
FIG. 14(b) illustrates the formation of a digital boundary scan path.
Figure 15:
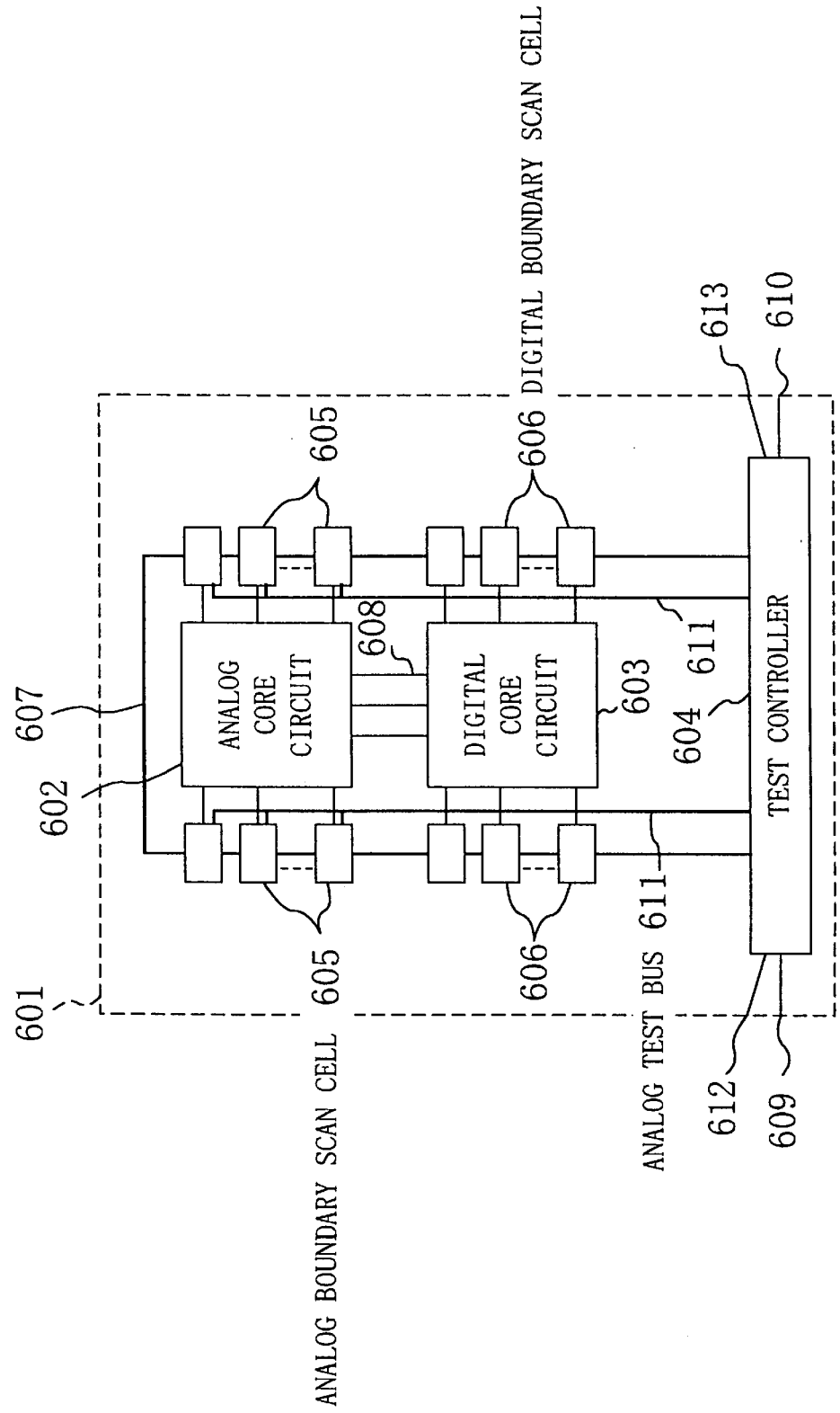
FIG. 15 shows the structure of a conventional integrated circuit.

In testing the digital core circuit 103, the switches 112, 113, 317, 420, and 421 are switched as illustrated in FIG. 14(b). As a result, the connecting line 114, the second boundary scan path 307, the first bypass 310, the fourth boundary scan path 411, the third boundary scan path 311, and the connecting line 115 are connected in series to compose a digital boundary scan path 501, as indicated by the bold line in the drawing.

In the integrated circuit according to the present embodiment, a signal from the analog core circuit 102 is transmitted to the digital core circuit 103 via the connecting lines 109. However, since the scan cells 428 intervening the respective connecting lines 109 are placed inside the analog boundary scan path 500, only the analog boundary scan path 500 is used in testing the analog core circuit 102 so that the analog core circuit 102 is signally disconnected from the digital core circuit 103 completely. The same effect can also be achieved in testing the digital core circuit 103.

When a test pattern for singly testing the digital core circuit 103 has already been provided, parallel input data representing the test pattern is converted to serial input data and the obtained serial input data is inputted to the data input terminal 110, which allows easy testing of the digital core circuits 103.

We claim:

1. An integrated circuit comprising:

an analog circuit and a digital circuit;

a plurality of analog boundary scan cells each connected to said analog circuit to receive test control data for bringing the analog circuit into a testable state;

a plurality of digital boundary scan cells each connected to said digital circuit to input test data to the digital circuit or receive a test result outputted from said digital circuit;

an analog boundary scan path for connecting in series only said analog boundary scan cells;

a digital boundary scan path for connecting in series only said digital boundary scan cells;

another analog circuit;

a plurality of other analog boundary scan cells connected to said other analog circuit to receive another test control data for bringing the other analog circuit into the testable state;

another analog boundary scan path for connecting in series only said other analog boundary scan cells;

a switch connected to respective leading points of said analog boundary scan path and said other analog boundary scan path; and another switch connected to respective terminal points of said analog boundary scan path and said other analog boundary scan path.

2. An integrated circuit according to claim 1, further comprising:

a test controller for testing said two analog circuits and said digital circuit, said test controller controlling said two switches.

3. An integrated circuit comprising:

an analog circuit and a digital circuit;

a plurality of analog boundary scan cells each connected to said analog circuit to receive test control data for bringing the analog circuit into a testable state;

a plurality of digital boundary scan cells each connected to said digital circuit to input test data to the digital circuit or receive a test result outputted from said digital circuit;

an analog boundary scan path for connecting in series only said analog boundary scan cells;

a digital boundary scan path for connecting in series only said digital boundary scan cells;

another digital circuit;

a plurality of other digital boundary scan cells connected to said other digital circuit to input still another test data to the other digital circuit or receive a test result outputted from the other digital circuit;

another digital boundary scan path for connecting in series only said other digital boundary scan cells;

a switch connected to respective leading points of said digital boundary scan path and said other digital boundary scan path; and another switch connected to respective terminal points of said digital boundary scan path and said other digital boundary scan path.

4. An integrated circuit according to claim 3, further comprising:

a test controller for testing said analog circuit and said two digital circuits, said test controller controlling said two switches.

5. An integrated circuit comprising:

an analog circuit and a digital circuit;

a plurality of analog boundary scan cells each connected to said analog circuit to receive test control data for bringing the analog circuit into a testable state;

a plurality of digital boundary scan cells each connected to said digital circuit to input test data to the digital circuit or receive a test result outputted from said digital circuit;

a first boundary scan path for connecting in series said analog boundary scan cells;

a second boundary scan path for connecting in series some of said digital boundary scan cells and a third boundary scan path for connecting in series the other of said digital boundary scan cells; and first, second and third bypasses disposed in parallel with said first, second, and third boundary scan paths, respectively, said first boundary scan path and said second and third bypasses being connected in series to form an analog boundary scan path for connecting in series only said analog boundary scan cells, said second and third boundary scan paths and said first bypass being connected in series to form a digital boundary scan path for connecting in series only said digital boundary scan cells.

6. An integrated circuit according to claim 5, further comprising:

a switch connected to respective one ends of said first boundary scan path and said first bypass and to respective one ends of said second boundary scan path and said second bypass; and another switch connected to the respective other ends of said first boundary scan path and said first bypass and to the respective other ends of said third boundary scan path and said third bypass.

7. An integrated circuit according to claim 6, further comprising:

a test controller for testing said analog circuit and said digital circuit, said test controller controlling said two switches such that:

in testing said analog circuit, one end of said first boundary scan path is connected to one end of said second bypass and the other end of said first boundary scan path is connected to one end of said third bypass, and in testing said digital circuit, one end of said second boundary scan path is connected to one end of said first bypass and the other end of said first bypass is connected to one end of said third boundary scan path.

8. An integrated circuit according to claim 5, wherein at least one of said second and third boundary scan paths is divided into a plurality of boundary scan paths disposed in parallel, each of the boundary scan paths connecting in series some of the digital boundary scan cells.

9. An integrated circuit comprising:

an analog circuit and a digital circuit;

a plurality of analog boundary scan cells each connected to said analog circuit to receive test control data for bringing the analog circuit into a testable state;

a plurality of digital boundary scan cells each connected to said digital circuit to input test data to the digital circuit or receive a test result outputted from said digital circuit;

a first boundary scan path for connecting in series said digital boundary scan cells;

a second boundary scan path for connecting in series some of said analog boundary scan calls and a third boundary scan path for connecting in series the other of said analog boundary scan cells; and first, second and third bypasses disposed in parallel with said first, second and third boundary scan paths, respectively, said first boundary scan path and said second and third bypasses being connected in series to form a digital boundary scan path for connecting in series only said digital boundary scan cells, said second and third boundary scan paths and said first bypass being connected in series to form an analog boundary scan path for connecting in series only said analog boundary scan cells.

10. An integrated circuit according to claim 9, further comprising:

a switch connected to respective one ends of said first boundary scan path and said first bypass and to respective one ends of said second boundary scan path and said second bypass; and another switch connected to the respective other ends of said first boundary scan path and said first bypass and to the respective other ends of said third boundary scan path and said third bypass.

11. An integrated circuit according to claim 10, further comprising:

a test controller for testing said analog circuit and said digital circuit, said test controller controlling said two switches such that:

in testing said digital circuit, one end of said first boundary scan path is connected to one end of said second bypass and the other end of said first boundary scan path is connected to one end of said third bypass, and in testing said analog circuit, one end of said second boundary scan path is connected to one end of said first bypass and the other end of said first bypass is connected to one end of said third boundary scan path.

12. An integrated circuit according to claim 9, wherein at least one of said second and third boundary scan paths is divided into a plurality of boundary scan paths disposed in parallel, each of the boundary scan paths connecting in series some of the analog boundary scan cells.

13. An integrated circuit according to claim 5 or 9, further comprising:

a plurality of connecting lines for connecting said analog circuit and said digital circuit;

scan cells disposed to intervene said respective connecting lines; and a fourth boundary scan path for connecting in series said scan cells, said fourth boundary scan path composing a part of said analog or digital boundary scan path.

14. An integrated circuit according to claim 13, further comprising:

a fourth bypass disposed in parallel with said fourth boundary scan path;

a switch for connecting one end of either of said fourth boundary scan path and said fourth bypass to the first boundary scan path or to the first bypass; and another switch for connecting the other end of either of said fourth boundary scan path and said fourth bypass to the third boundary scan path or to the third bypass.

15. An integrated circuit according to claim 14, further comprising a test controller for testing said analog circuit and said digital circuit, said test controller controlling said two switches.

* * * * *